United States Patent [19]
Shibagaki et al.

[11] Patent Number: 5,422,615
[45] Date of Patent: Jun. 6, 1995

[54] HIGH FREQUENCY CIRCUIT DEVICE

[75] Inventors: Nobuhiko Shibagaki; Mitsutaka Hikita, both of Hachioji; Toyoji Tabuchi, Yokohama; Takatoshi Akagi, Kokubunji; Satoshi Wakamori, Yokohama; Tomomi Matsumoto, Hiratsuka, all of Japan

[73] Assignees: Hitachi, Ltd., Tokyo; Hitachi Video & Information System, Inc., Kanagawa, both of Japan

[21] Appl. No.: 120,470

[22] Filed: Sep. 14, 1993

[30] Foreign Application Priority Data

Sep. 14, 1992 [JP] Japan .................. 4-244510

[51] Int. Cl.⁶ ............ H01L 23/12; H01P 5/00
[52] U.S. Cl. .................... 333/246; 257/704; 257/728; 333/33; 333/247
[58] Field of Search ............ 333/33, 193, 246, 247; 257/728, 704; 330/307

[56] References Cited

U.S. PATENT DOCUMENTS 4,827,327  5/1989  Miyauchi et al. .......... 257/728 X

FOREIGN PATENT DOCUMENTS 2-90805   3/1990  Japan .
3-205908  9/1991  Japan .

Primary Examiner—Paul Gensler
Attorney, Agent, or Firm—Fay, Sharpe, Beall, Fagan, Minnich & McKee

[57] ABSTRACT

In a high frequency circuit device, inductive circuit elements constituting a matching circuit are constructed of so-called helical coils having fine metal wires wound in a hollow solenoid form, which are disposed inside a package in which a high frequency circuit element such as a surface acoustic wave element or the like is mounted. The high frequency circuit device may be utilized in equipment such as wireless communication equipment for reducing the size as well as providing good high frequency characteristics.

33 Claims, 6 Drawing Sheets

HIGH FREQUENCY CIRCUIT DEVICE

BACKGROUND OF THE INVENTION

The present invention relates to a high frequency circuit device using a high frequency circuit element such as a surface acoustic wave (SAW) element, and more particularly to a high frequency circuit device for use in mobile communications which is required to be compact and have high performance filter characteristics.

Conventionally, a high frequency circuit device has generally been produced by mounting a high frequency circuit element in an air-tight sealable TO-can package and providing a matching circuit outside the high frequency circuit element by the use of a printed circuit element or a lumped circuit element, as disclosed, for example, in JP-A-3-205908 (laid open on Sep. 9, 1991). A surface acoustic wave element will be explained below as an example of the high frequency circuit element.

FIG. 2A is a cross-sectional view showing how a conventional surface acoustic wave device is mounted, and FIG. 2B shows a bottom view of the same. A package 7 is mounted on a high frequency circuit substrate (mother board) 16, and a matching circuit is realized by forming an inductive printed circuit element 15, for example, on the rear surface of the high frequency circuit substrate 16.

While FIGS. 2A, 2B illustrate a TO-can package, the structure is roughly identical to the surface mounted device shown in FIG. 3. A surface mounting package 7 shown in FIG. 3 has a substrate 1, a frame 2 formed to stand on a surface of the substrate 1, and a lid 3 for providing, in combination with the frame 2 and substrate 1, an air-tight space in which a high frequency circuit element 8 is disposed. Signal electrodes on the element are connected with a signal electrode pattern 6 on the substrate 1 via wires 9, while grounding electrodes on the element are connected with a grounding electrode pattern on the substrate 1. Such a surface mounting package also needs an external matching circuit, as in the case of the TO-can package.

Generally, the impedance, viewed from input/output terminals of a surface acoustic wave element, is capacitive due to a capacitance between electrodes of a transducer for exciting the surface acoustic wave. For this reason, if a surface acoustic wave element is mounted on a mother board of a terminal of communication equipment or the like, high frequency signals are reflected at an end of the surface acoustic wave element due to a mismatch of impedance between the high frequency signals supplied from the mother board and the surface acoustic wave element. To avoid such an impedance mismatch, a matching circuit is provided on the mother board to cancel capacitive components of the surface acoustic wave element.

FIGS. 4A, 4B, 4C and 4D show examples of surface acoustic wave elements 20 and representative matching circuits, in each of which the surface acoustic wave element is connected with external circuits through matching circuits, each composed of inductive circuit elements or inductive and capacitive circuit elements. As the inductive circuit element, a meander line on the mother board is used, while a lumped capacitance or gap capacitance is used as the capacitive circuit element.

U.S. application Ser. No. 07/924,091 filed on Aug. 3, 1992 discloses a high frequency circuit device in which a film-shaped inductance is disposed in an air-tight space where a high frequency circuit element is disposed.

SUMMARY OF THE INVENTION

In recent years, reduction in size is required, particularly, for equipment utilizing high frequency circuit devices such as wireless communication equipment.

However, in the prior art, when a surface acoustic wave element is actually used in a high frequency circuit device, a matching circuit must be mounted outside of a package, which contributes to hindering the reduction in size of equipment utilizing high frequency circuits, such as wireless communication equipment.

JP-A-2-90805 (laid open on Mar. 30, 1990) has proposed that a matching circuit composed of printed circuit elements be formed inside a multi-layer ceramic package. In this case, however, the Q-factor of inductance in the printed circuit element is decreased by a conductor loss of the printed circuit element itself in the printed circuit element and a dielectric loss of a dielectric substrate, causing an increase in filter loss. Stated another way, a decrease in the Q factor of inductance causes a problem of deteriorating the high frequency characteristics of the high frequency circuit device.

It is an object of the present invention to provide a high frequency circuit device which is effective in reducing the size of equipment utilizing the high frequency circuit devices such as wireless communication equipment and which exhibits good high frequency characteristics, and to provide wireless communication equipment.

The above object can be achieved by securing the high frequency circuit element on the surface of a substrate constituting a package through conductor patterns and providing a helical coil in a hole formed in the rear surface of the substrate.

More specifically, the above object can be achieved by a high frequency circuit device comprising a first substrate; a frame implanted on the surface of the first substrate; a lid for forming an air-tight space with the frame and the first substrate; a second substrate formed adjacent to the rear surface of the first substrate and having holes; a first conductor pattern and a second conductor pattern formed on the surface of the first substrate; a third conductor pattern and a fourth conductor pattern formed on the rear surface of the first substrate, at least portions of which are exposed in the holes of the second substrate; a fifth conductor pattern and a sixth conductor pattern formed on the rear surface of the second substrate; a first conductor for connecting the first conductor pattern with the third conductor pattern; a second conductor for connecting the second conductor pattern with the sixth conductor pattern; a third conductor for connecting the fourth conductor pattern with the fifth conductor pattern; a high frequency circuit element accommodated in the air-tight space and secured on the second conductor pattern, and having a surface electrode connected with the second conductor pattern through a wire; and a first helical coil accommodated in a first hole of the holes of the second substrate, and connected between the third conductor pattern and the fourth conductor pattern.

Since the helical coil is disposed in the hole formed in the rear surface of the substrate constituting the package, an additional inductive element need not be formed on the mother board for constituting a matching circuit (having complex conjugate impedance with the input-/output impedance of the high frequency circuit element), which is effective in reducing the size of equipment utilizing the high frequency circuit device such as wireless communication equipment.

It is possible to manufacture a helical coil, even with a small solenoid diameter of approximately 1 mm, having a large inductance value ranging from several nH to a few tens of nH and a large Q-factor of approximately 100, which affects the high frequency characteristics. Such a helical coil having a Q-factor of approximately 100 is regarded as a good inductance, in consideration of a conventional inductive printed circuit element formed on a mother board which normally has a Q-factor of approximately 50. Therefore, when such a helical coil is used as a component of a matching circuit, a high frequency circuit device incorporating this matching circuit exhibits good high frequency characteristics. When a surface acoustic wave element is used as a high frequency circuit element, an increase in filter loss can be prevented from occurring due to the matching circuit, thus presenting good high frequency characteristics.

Also, since the helical coils are disposed on the rear surface side of a substrate constituting the package, the conductor patterns, which are arranged between the high frequency circuit element and the helical coils, function as electromagnetic shields for both. If the helical coils were disposed on the surface side of a package constituting the package, an electromagnetic shield would have to be additionally provided.

As used in this specification, "first substrate" refers to a remaining substrate portion, which is different from the "second substrate" having the holes. Other conductor patterns or the like may be disposed inside the first substrate.

Further, not only the helical coils but one or more lumped capacitors may be accommodated in the spaces formed in the substrate constituting the package.

DESCRIPTION OF THE PREFERRED EMBODIMENTS

Figure 1:
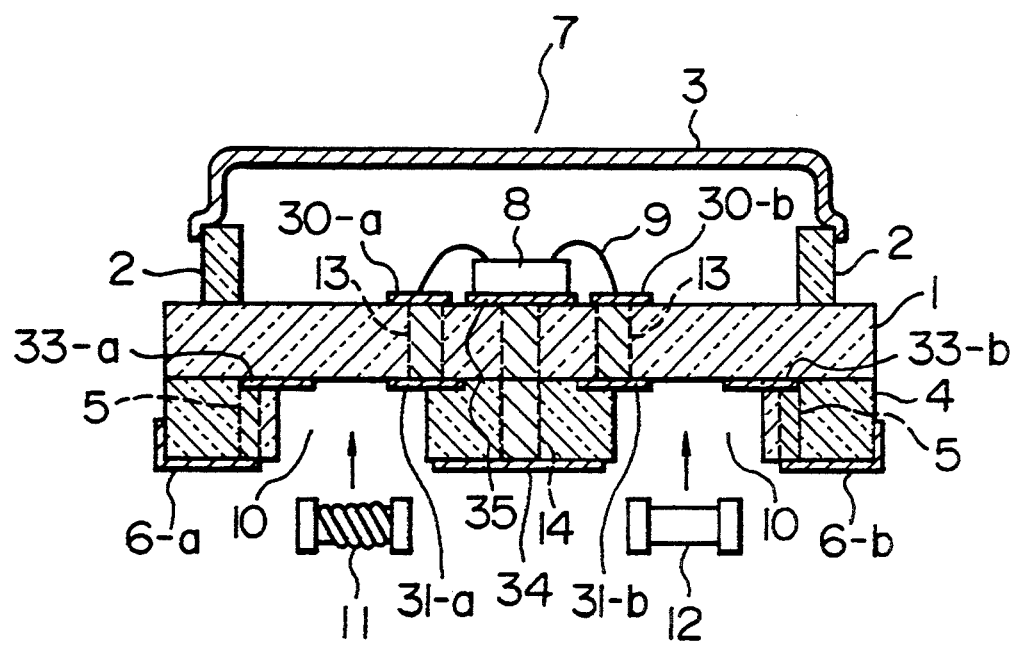
FIG. 1 is a cross-sectional view showing a specific example of a high frequency circuit device according to the present invention.
Figure 2A:
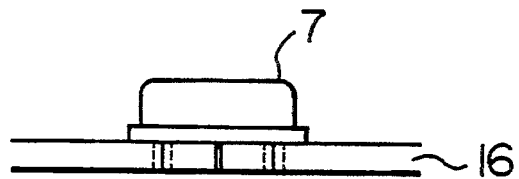
FIGS. 2A, 2B are a cross-sectional view and a bottom view, respectively, showing a mounted state of a conventional surface acoustic wave element.
Figure 2B:
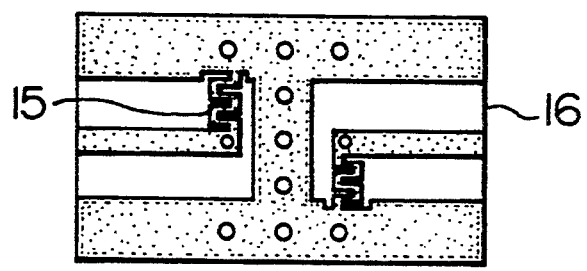
Figure 3:
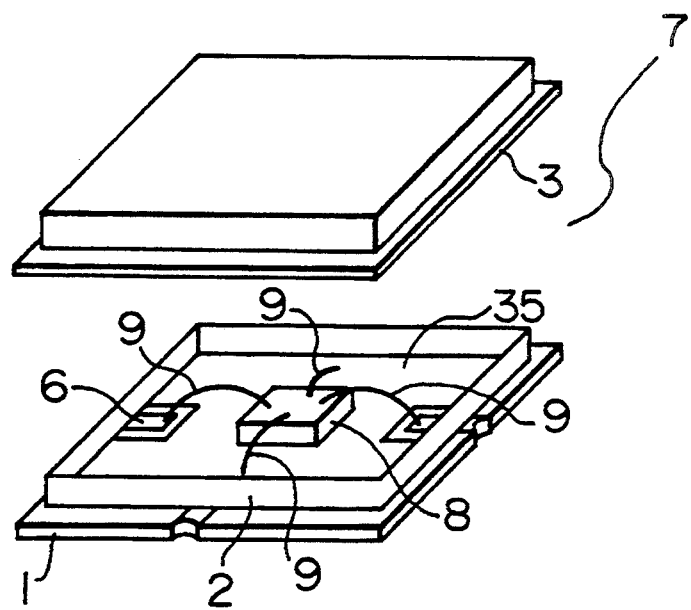
FIG. 3 is a perspective view showing a mounted state of a conventional surface acoustic wave element.
Figure 4A:
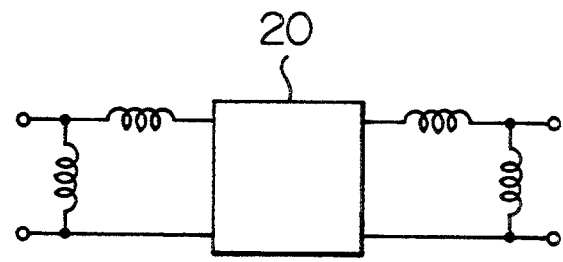
FIGS. 4A, 4B, 4C and 4D are equivalent circuit diagrams showing known matching circuits.
Figure 4B:
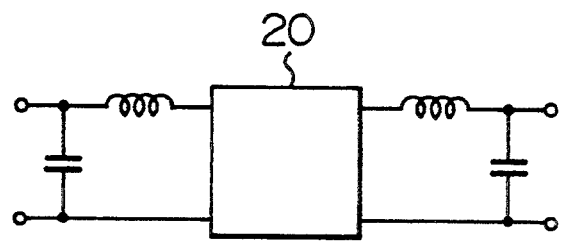
Figure 4C:
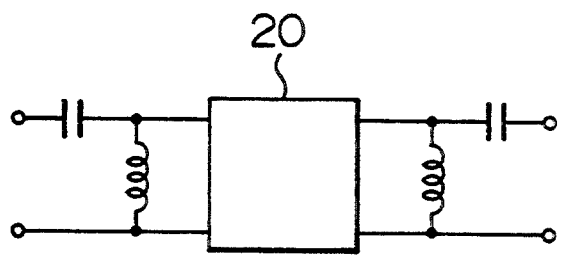
Figure 4D:
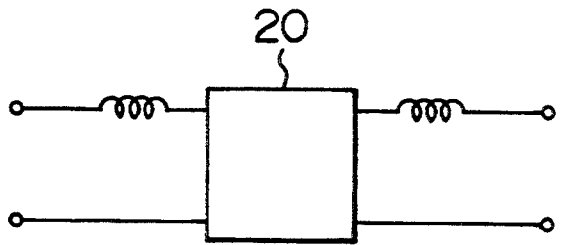

FIG. 1 shows a cross-sectional view of a specific example of the present invention. The external structure of a package 7 includes a frame 2 implanted on one surface of a substrate 1, to which a lid 3 is secured to maintain an air-tight condition. Also, on the other surface of the substrate 1, there is secured a substrate 4 which is partially formed with holes 10.

The package 7 connects: signal conductor patterns 33-a, 33-b with external signal connecting terminals 6-a, 6-b respectively through via-hole conductors 5 passing through the substrate 4; signal conductor patterns 30-a, 30-b with signal conductor patterns 31-a, 31-b respectively through conductors 13 passing through the substrate 1; and an earth conductor pattern 35 with an external earth connecting terminal 34 through a conductor 14 passing through the substrates 4 and 1.

Specifically, the via-hole conductor 14 is disposed between two holes, and each inductance 11 connecting to the surface electrode of the high frequency circuit element 8 is disposed in each hole, so the via-hole conductor 14 acts to lower mutual coupling between two inductances 11. Thus, crosstalk between input and output terminals of the high frequency circuit element 8 is decreased.

On the earth (grounding) conductor pattern 35 in the package 7 constructed as described above, a high frequency circuit element 8 is mounted, and two signal electrodes of the element 8 are respectively connected with the signal conductor patterns 30-a, 30-b, through wires 9. Also, a helical coil 11 or a lumped capacitor 12, which is a circuit element constituting a matching circuit, is disposed in a space defined by each of the holes 10 formed in the substrate 4. At this time, these circuit elements are connected between the signal conductor patterns 31-a and 33-a or between the signal conductor patterns 31-b and 33-b.

When one of the signal electrodes of the high frequency circuit element 8 is connected with the earth conductor pattern 35 through a wire, one of the signal external connecting terminals 6-a, 6-b (as well as a signal conductor pattern and via-hole conductor connected thereto) is rendered unnecessary.

Figure 5:
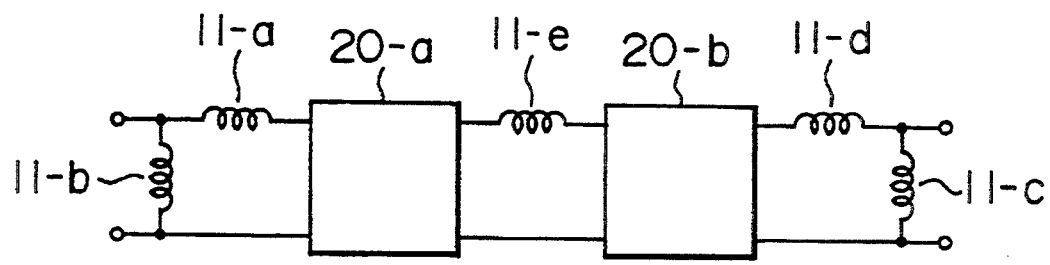
FIG. 5 is a circuit diagram showing a high frequency circuit device according to a first embodiment of the present invention.
Figure 8:
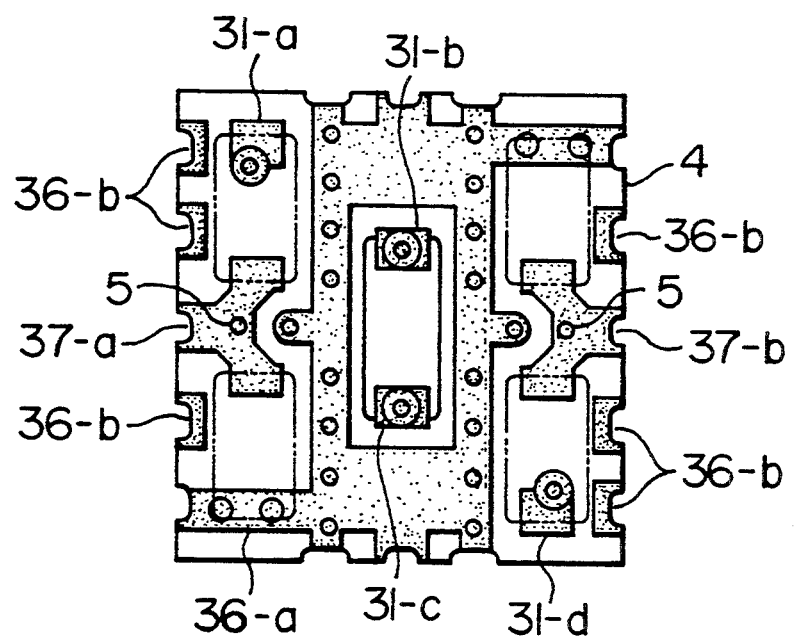
FIG. 8 is a top view showing the inside of a substrate in the package of the high frequency circuit device according to the first embodiment of the present invention.
Figure 9:
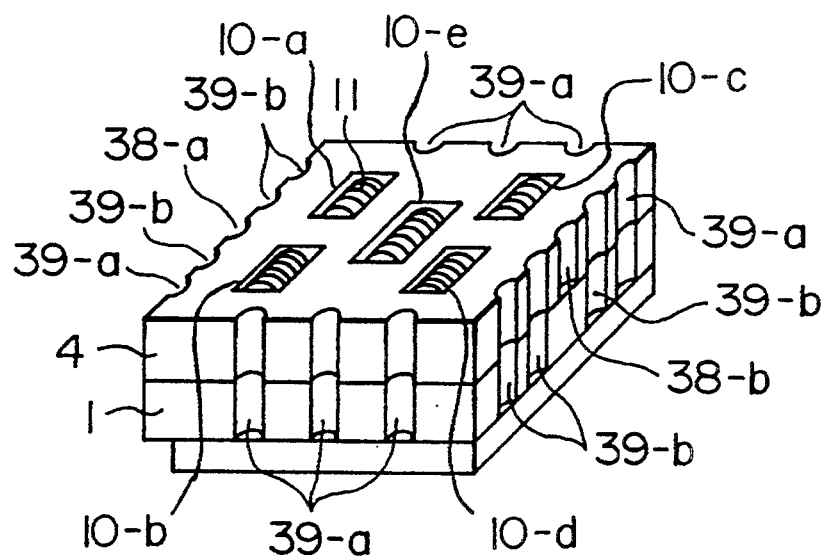
FIG. 9 is a perspective view showing the high frequency circuit device according to the first embodiment of the present invention.

By disposing the matching circuit inside the package, time and labor for considering impedance matching can be saved when designing wireless communication equipment. Even if all circuit elements constituting the matching circuit are not disposed in the holes 10 of the substrate 4, but only the helical coil 11 is disposed in the hole 10, labor for the impedance matching can also be reduced. Further, since the helical coil 11 or the lumped capacitor 12 disposed in each of the holes 10 of the substrate 4 may be easily replaced, adjustment can be easily made when the input/output impedance of the high frequency circuit element varies, thus improving the yield of the high frequency circuit device. First Embodiment The high frequency circuit device according to a first embodiment of the present invention will be explained with reference to FIGS. 5–9. FIG. 5 shows a circuit arrangement of this embodiment, and FIGS. 6–8 which show the arrangement of the external signal connecting terminals, external earth connecting terminals, and conductor patterns, are a top view showing a state when the lid of the package is opened, a bottom view of the package, and a top view of the inside of the substrate in the package, respectively. Also, FIG. 9 is a perspective view of the high frequency circuit device particularly showing conductors on lateral surfaces of the package (lateral conductors).

Referring to FIG. 5, in the high frequency circuit device of this embodiment, two high frequency circuit elements 20-a, 20-b each have one end connected to each other through a matching circuit composed of a series coil 11-e, and the other end (input/output terminal) connected to matching circuits composed of series arm and shunt arm coils 11-a and 11-b, and 11-d and 11-c, respectively.

The external structure of a package 7 is similar to that of FIG. 1, and includes a frame 2 implanted on one surface of a substrate 1, to which a lid 3 (not shown in FIGS. 5–9) is secured to maintain an air-tight condition. Also, on the other surface of the substrate 1, there is secured a substrate 4 which is partially formed with holes 10-a, 10-b, 10-c, 10-d, 10-e, as shown in FIG. 9.

Figure 6:
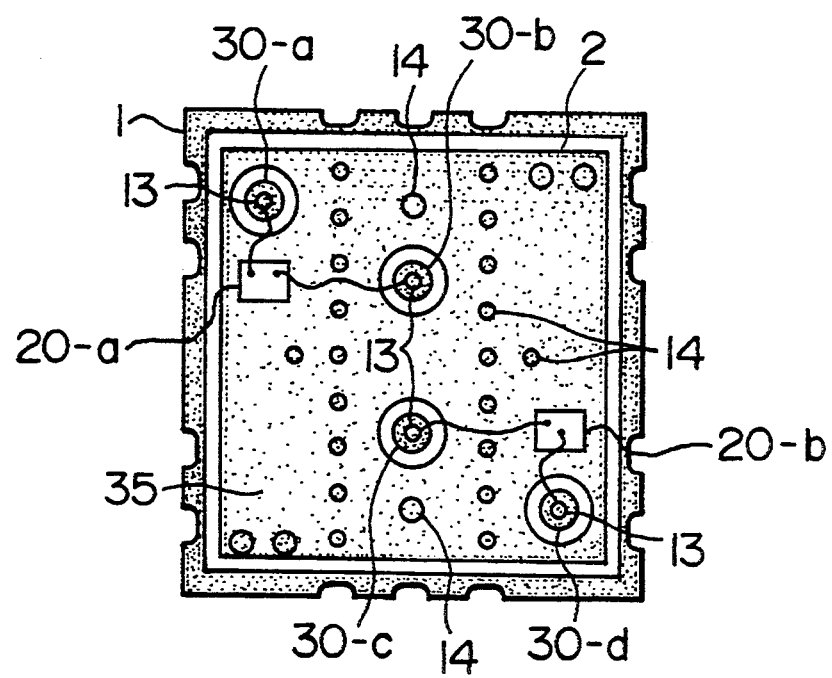
FIG. 6 is a top view of the high frequency circuit device according to the first embodiment of the present invention, showing a state when a lid of a package is opened.
Figure 7:
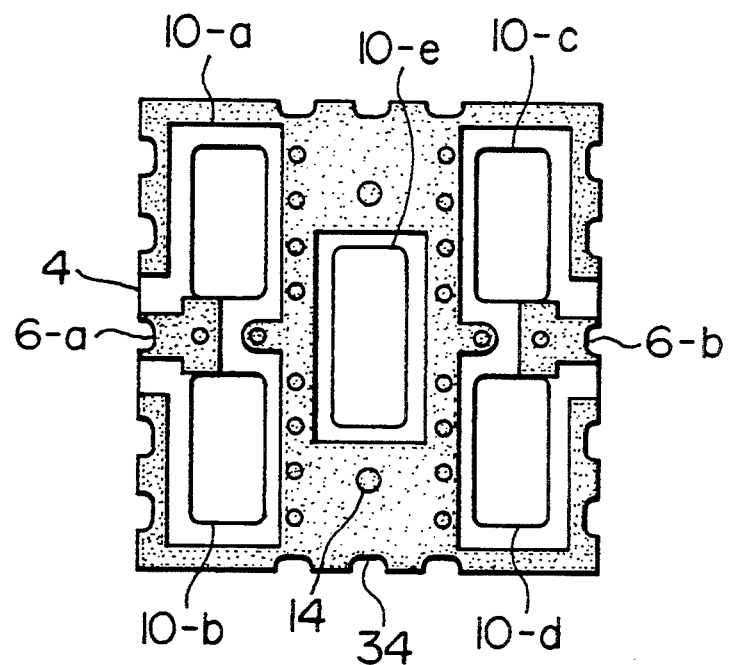
FIG. 7 is a bottom view showing the package of the high frequency circuit device according to the first embodiment of the present invention.

Unlike the structure shown in FIG. 1, conductor patterns, external signal connecting terminals and external earth connecting terminals of this embodiment are arranged in the following manner. It should also be noted that the substrate 4 is formed with a different number of holes from the substrate 4 of FIG. 1. As shown in FIG. 6, signal conductor patterns 30-a, 30-b, 30-c, 30-d and an earth conductor pattern 35 are arranged on the surface on which high frequency circuit elements 20-a, 20-b are secured. Also, as shown in FIG. 7, external signal connecting terminals 6-a, 6-b, and an external earth connecting terminal 34 are arranged on the bottom surface of the package 7, and holes 10-a, 10-b, 10-c, 10-d, 10-e are formed in the bottom surface of the package 7. Further, as shown in FIG. 8, earth conductor patterns 36-a, 36-b; and signal conductor patterns 31-a, 31-b, 31-c, 31-d, 37-a, 37-b are arranged between the substrate 1 and the substrate 4. Here, the signal conductor patterns 30-a, 30-b, 30-c, 30-d are connected with the signal conductor patterns 31-a, 31-b, 31-c, 31-d through via-hole conductors 13, respectively. The earth conductor pattern 35 is connected with the earth external connecting terminal 34 through both of a plurality of via-hole conductors 14 and a plurality of lateral surface conductors 39-a, 39-b. The lateral surface conductors 39-a, 39-b are connected with the earth conductor patterns 36-a, 36-b, respectively. The signal conductor patterns 37-a, 37-b are connected with the external signal connecting terminals 6-a, 6-b, respectively, through both of via-hole conductors 5 and lateral surface conductors 38-a, 38-b.

The two high frequency circuit elements 20-a, 20-b are mounted on the earth conductor pattern 35, and four signal electrodes of these elements are connected with the signal conductor patterns 30-a, 30-b, 30-c, 30-d through wires. Also, in the holes 10-a, 10-b, 10-c, 10-d, 10-e formed in the substrate 4, there are disposed helical coils 11-a, 11-b, 11-c, 11-d, 11-e, respectively, as inductances constituting respective matching circuits. In this event, the helical coils 11-a, 11-b, 11-c, 11-d, 11-e are connected between the signal conductor patterns 31-a and 37-a; 36-a and 37-a; 36-a and 37-b; 31-d and 37-b; and 31-b and 31-c, respectively.

While a high frequency circuit device incorporating two high frequency circuit elements along with a matching circuit has been described in this embodiment, it goes without saying that the present invention can be applied to any high frequency circuit device irrespective of the number of incorporated high frequency circuit elements.

Also, while the matching circuit is composed solely of coils in this embodiment, conventionally known matching circuits as shown in FIG. 4 may of course be employed.

Further, while this embodiment employs two layers of substrates, the present invention may be applied to three or more layers of substrates, i.e., any substrate irrespective of the number of constituent layers. In this case, the number of layers are counted in a manner that the layers are regarded to be separated by the conductor patterns. However, from a viewpoint of the concept of the invention, the constituent substrates may be classified into two: a substrate having holes and the other substrate.

It should be noted that part of the helical coils of this embodiment may be replaced with meander lines as long as the effects of the present invention are not lost.

When the matching circuit includes a capacitance, an inter-layer capacitance or a gap capacitance may be used as the capacitance to an extent that the effects of the invention are not lost.

Also, the helical coils or lumped capacitors disposed in the holes of the substrate may be utilized for constituting a filter circuit. This filter circuit may be effectively used when a frequency range, which cannot be removed by a surface acoustic wave filter alone, is to be removed. Such a filter circuit is also effective when a high frequency circuit element is a semiconductor amplifier element for removing unnecessary frequency components after amplification.

When a surface acoustic wave element is used as a high frequency circuit element, and a semiconductor amplifier element is further used to integrate a passive element and an active element, the semiconductor element may be mounted in a hole of the substrate. Second Embodiment A method of mounting a high frequency circuit device on a mother board will be shown as a second embodiment of the present invention. With the type of high frequency circuit device packaged as shown in. FIG. 1 or FIG. 9, the device is mounted with the holes (reference numeral 10 in FIG. 1) of the substrate 4 oriented to the mother board side, as a first mounting method.

Alternatively, as a second method, after helical coils or lumped capacitors have been disposed in the holes 10, the holes 10 are filled with non-conductive resin. According to the second method, a soldering material used to mount the device on a mother board is prevented from entering the holes 10 to cause short-circuiting of the helical coils or lumped capacitors.

Figure 10:
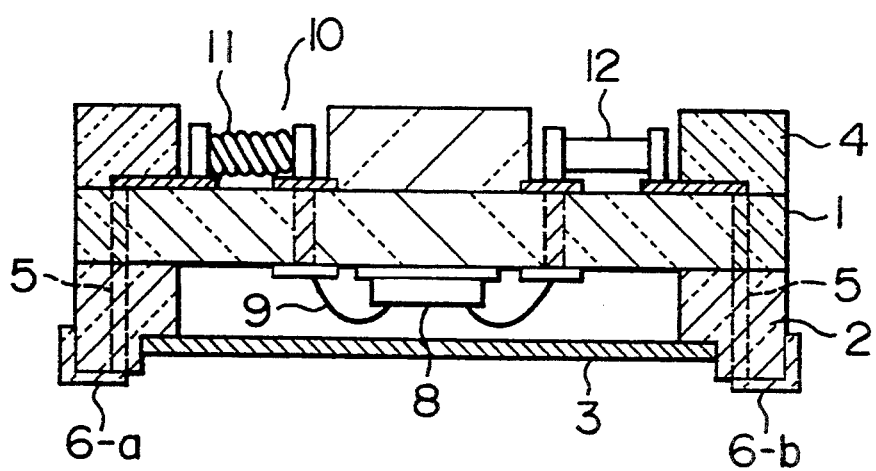
FIG. 10 is a cross-sectional view used for explaining how to mount a high frequency circuit device according to a second embodiment of the present invention on a mother board.

Further alternatively, as a third method, the device is mounted on a mother board with the holes of the substrate 4 oriented to the opposite side of the mother board. FIG. 10 shows a cross-sectional view of a high frequency circuit device suitable to the application of the third mounting method. Via-hole conductors 5 are extended to a lid 3, and external signal connecting terminals 6-a, 6-b are provided on a frame 2. The lid 3 is arranged such that the surface thereof will not project from the surface of the frame 2 so as to provide good connection between the external signal connecting terminals 6-a, 6-b and the mother board.

Though not shown in FIG. 10, the rear surface of a high frequency circuit element 8 is connected to the earth electrode of the mother board by the path of via-hole conductor through the substrates 1, 4 and lateral conductor along the substrates 1, 4 and frame 2. The third method eliminates a fear of the short-circuiting of the helical coils or lumped capacitors by a soldering material flowing into the holes 10, without filling the holes 10 with non-conductive resin.

According to the present invention, labor and time required for considering an impedance matching can be removed in a designing process of wireless communication equipment, which results in improving the developing efficiency of the wireless communication equipment.

The high frequency circuit device of the present invention will produce significant effects when applied to parts to which extremely strict electric performance is required, such as a first-stage filter for an antenna of mobile communication equipment.

What is claimed is:

1. A high frequency circuit device comprising:
   a package having an air-tight space inside thereof, said package including a substrate and a lid over a first surface of the substrate, said substrate having a hole in a second surface thereof;
   a high frequency circuit element secured on said first substrate surface in said air-tight space; and
   a helical signal coil disposed in said hole formed in said second substrate surface, wherein said helical signal coil is substantially oriented parallel to a plane containing said second substrate surface.

2. A high frequency circuit device according to claim 1, wherein said high frequency circuit element is a surface acoustic wave element.

3. A wireless communication equipment comprising:
   a mother board and the high frequency circuit device defined in claim 2 mounted on said mother board.

4. A high frequency circuit device according to claim 1, wherein said high frequency circuit device is mounted on a mother board with said air-tight space being oriented to the side of said mother board.

5. A wireless communication equipment comprising:
   a mother board and the high frequency circuit device defined in claim 1 mounted on said mother board.

6. A high frequency circuit device according to claim 1, further comprising a first electrical conductor electrically connecting said first substrate surface to said second substrate surface, and a second electrical conductor at said second substrate surface, wherein said helical signal coil electrically connects said first electrical conductor at said second substrate surface to said second electrical conductor at said second substrate surface.

7. A high frequency circuit device according to claim 1, further comprising a plurality of conductor patterns on said first substrate surface, wherein said conductor patterns constitute an electromagnetic shield between the helical signal coil and the high frequency circuit element.

8. A high frequency circuit device according to claim 1, wherein said helical signal coil has a Q between about 50 and about 100.

9. A high frequency circuit device according to claim 1, wherein said helical signal coil is an impedance matching device disposed in a high frequency signal line of said package, said high frequency signal line being electrically connected to said high frequency circuit element.

10. A high frequency circuit device comprising:
    a first substrate;
    a frame implanted on a surface of said first substrate;
    a lid for forming an air-tight space with said frame and said first substrate;
    a second substrate formed adjacent to a rear surface of said first substrate, and having holes;
    a first conductor pattern and a second conductor pattern formed on the surface of said first substrate;
    a third conductor pattern and a fourth conductor pattern formed on the rear surface of said first substrate, at least portions of which are exposed in the holes of said second substrate;
    a fifth conductor pattern and a sixth conductor pattern formed on a rear surface of said second substrate;
    a first conductor for connecting said first conductor pattern with said third conductor pattern;
    a second conductor for connecting said second conductor pattern with said sixth conductor pattern;
    a third conductor for connecting said fourth conductor pattern with said fifth conductor pattern;
    a high frequency circuit element accommodated in said air-tight space and secured on said second conductor pattern, and having a surface electrode connected with said first conductor pattern through a wire; and
    a first helical coil accommodated in a first hole of said holes in said second substrate, and connected between said third conductor pattern and said fourth conductor pattern.

11. A high frequency circuit device according to claim 10, wherein said high frequency circuit element is a surface acoustic wave element.

12. A wireless communication equipment comprising:
    a mother board and the high frequency circuit device defined in claim 11 mounted on said mother board.

13. A high frequency circuit device according to claim 10, wherein said high frequency circuit device comprises a plurality of high frequency circuit elements, at least one of said high frequency circuit elements is a semiconductor element, and at least one of said high frequency circuit elements is a surface acoustic wave element.

14. A high frequency circuit device according to claim 13, wherein said semiconductor element is disposed in a space defined by one of said holes partially formed in said second substrate.

15. A wireless communication equipment comprising:
    a mother board and the high frequency circuit device defined in claim 14 mounted on said mother board.

16. A wireless communication equipment comprising:
    a mother board and the high frequency circuit device defined in claim 13 mounted on said mother board.

17. A high frequency circuit device according to claim 10, further comprising at least one impedance matching circuit, including said helical coil and at least one electrical component selected from the group consisting of a conductive meander line, a multi-layer capacitance, a gap capacitance, and a conductive line between said first and second substrates, said impedance matching circuit being electrically connected to said high frequency circuit device.

18. A wireless communication equipment comprising:

a mother board and the high frequency circuit device defined in claim 17 mounted on said mother board.

19. A high frequency circuit device according to claim 10, wherein said holes are filled with resin.

20. A high frequency circuit device according to claim 10, wherein said high frequency circuit device further comprises:
- a seventh conductor pattern formed on the surface of said first substrate;
- an eighth conductor pattern and a ninth conductor pattern formed on the rear surface of said first substrate, at least portions of which are exposed in a second hole of said holes of said second substrate;
- a tenth conductor pattern formed on the rear surface of said second substrate;
- a fourth conductor for connecting said seventh conductor pattern with said eighth conductor pattern;
- a fifth conductor for connecting said ninth conductor pattern with said tenth conductor pattern;
- a wire for connecting a surface electrode of said high frequency circuit element with said seventh conductor pattern; and
- a second helical coil accommodated in the second hole of said second substrate,
- said first conductor and said fourth conductor being constructed by at least a via-hole conductor passing through said first substrate,
- said second conductor being constructed by at least a via-hole conductor passing through said second substrate, and
- said third conductor and said fifth conductor each being constructed by at least a via-hole conductor passing through said second substrate.

21. A high frequency circuit device according to claim 20, wherein said second conductor is additionally constructed by a lateral surface conductor passing along respective lateral surfaces of said first substrate and said second substrate.

22. A high frequency circuit device according to claim 10, wherein a lumped capacitor is disposed in a space defined by one of said holes in said second substrate.

23. A wireless communication equipment comprising:
- a mother board and the high frequency circuit device defined in claim 10 mounted on said mother board.

24. A high frequency circuit device comprising:
- a first substrate;
- a frame implanted on the surface of said first substrate;
- a lid for forming an air-tight space with said frame and said first substrate;
- a second substrate formed adjacent to the rear surface of said first substrate, and having holes;
- a first conductor pattern, a second conductor pattern, a third conductor pattern, a fourth conductor pattern, a fifth conductor pattern and a sixth conductor pattern formed on a surface of said first substrate;
- a seventh conductor pattern, an eighth conductor pattern, a ninth conductor pattern, a tenth conductor pattern, an eleventh conductor pattern and a twelfth conductor pattern formed on a rear surface of said first substrate;
- a first helical coil accommodated in a first hole of said holes of said second substrate, and connected between said seventh conductor pattern and said eighth conductor pattern, wherein at least some of the seventh, eighth, ninth, tenth, eleventh and twelfth conductor patterns are exposed in a second hole of said holes of said second substrate;
- a second helical coil accommodated in the second hole of said holes of said second substrate, and connected between said ninth conductor pattern and said tenth conductor pattern;
- a third helical coil accommodated in a third hole of said holes of said second substrate, and connected between said eleventh conductor pattern and said twelfth conductor pattern,
- a thirteenth conductor pattern, a fourteenth conductor pattern, a fifteenth conductor pattern and a sixteenth conductor pattern formed on a rear surface of said second substrate;
- a first conductor for connecting said first conductor pattern with said eighth conductor pattern;
- a second conductor for connecting said second conductor pattern with said fourteenth conductor pattern;
- a third conductor for connecting said third conductor pattern with said ninth conductor pattern;
- a fourth conductor for connecting said fourth conductor pattern with said tenth conductor pattern;
- a fifth conductor for connecting said fifth conductor pattern with said fifteenth conductor pattern;
- a sixth conductor for connecting said sixth conductor pattern with said eleventh conductor pattern;
- a seventh conductor for connecting said seventh conductor pattern with said thirteenth conductor pattern;
- an eighth conductor for connecting said twelfth conductor pattern with said sixteenth conductor pattern;
- a first high frequency circuit element accommodated in said air-tight space and secured on said second conductor pattern, and having two surface electrodes connected with said first conductor pattern and said third conductor pattern through wire respectively; and
- a second high frequency circuit element accommodated in said air-tight space and secured on said fifth conductor pattern, and having two surface electrodes connected with said fourth conductor pattern and said sixth conductor pattern through wire respectively;
- wherein said first conductor, said third conductor and said sixth conductor are each constructed by at least a via-hole conductor passing through said first substrate,
- said second conductor and said fifth conductor are each constructed by at least a via-hole conductor passing through said first substrate and said second substrate, and
- said seventh conductor and said eighth conductor are each constructed by at least a via-hole conductor passing through said second substrate.

25. A high frequency circuit device according to claim 24, wherein said second conductor and said fifth conductor are constructed by lateral surface conductors passing along respective lateral surfaces of said first substrate and said second substrate in addition to said via-hole conductor.

26. A high frequency circuit device according to claim 24, wherein said high frequency circuit device further comprises:
- a seventeenth conductor pattern formed on the rear surface of said first substrate, at least portions of which are exposed in a fourth hole of said holes of said second substrate;

an eighteenth conductor pattern formed on the rear surface of said first substrate, at least portions of which are exposed in a fifth hole of said holes of said second substrate;

a ninth conductor for connecting said seventeenth conductor pattern with said fourteenth conductor pattern;

a tenth conductor for connecting said eighteenth conductor pattern with said fifteenth conductor pattern;

a fourth helical coil accommodated in the fourth hole of said second substrate; and a fifth helical coil accommodated in the fifth hole of said second substrate, said seventh conductor pattern being exposed in the fourth hole of said second substrate, said twelfth conductor pattern being exposed in the fifth hole of said second substrate, said fourth helical coil being connected between said seventh conductor pattern and said seventeenth conductor pattern, said fifth helical coil being connected between said twelfth conductor pattern and said eighteenth conductor pattern, and said ninth conductor and said tenth conductor each being constructed by at least a via-hole conductor passing through said second substrate.

27. A high frequency circuit device according to claim 26, wherein said second conductor and said fifth conductor are constructed by lateral surface conductors passing along respective lateral surfaces of said first substrate and said second substrate in addition to said via-hole conductor.

28. A high frequency circuit device comprising:

a package, including a lid covering a first surface of a substrate, said substrate having a hole in a second surface thereof, wherein said lid and said substrate enclose an air-tight space inside said package;

a high frequency circuit element secured on said first substrate surface in said air-tight space; and a helical signal coil disposed in said hole formed in said second substrate surface;

wherein said high frequency circuit element is a surface acoustic wave element.

29. A high frequency circuit device comprising:

a package, including a lid covering a first surface of a substrate, said substrate having a hole in a second surface thereof, wherein said lid and said substrate enclose an air-tight space inside said package;

a high frequency circuit element secured on said first substrate surface in said air-tight space; and a helical signal coil disposed in said hole formed in said second substrate surface;

wherein said helical signal coil is an impedance matching device disposed in a high frequency signal line of said package, said high frequency signal line being electrically connected to said high frequency circuit element.

30. A high frequency circuit device according to claim 29, wherein said helical signal coil has a Q between about 50 and about 100.

31. Wireless communication equipment of the type including a terminal having a motherboard mounting a high frequency circuit device, the improvement wherein the high frequency circuit device comprises:

a package, including a lid covering a first surface of a substrate, said substrate having a hole in a second surface thereof, wherein said lid and said substrate enclose an air-tight space inside said package;

a high frequency circuit element secured on said first substrate surface in said air-tight space; and a helical signal coil disposed in said hole formed in said second substrate surface;

wherein said high frequency circuit element is a surface acoustic wave element.

32. Wireless communication equipment of the type including a terminal having a motherboard mounting a high frequency circuit device, the improvement wherein the high frequency circuit device comprises:

a package, including a lid covering a first surface of a substrate, said substrate having a hole in a second surface thereof, wherein said lid and said substrate enclose an air-tight space inside said package;

a high frequency circuit element secured on said first substrate surface in said air-tight space; and a helical signal coil disposed in said hole formed in said second substrate surface;

wherein said helical signal coil is an impedance matching device disposed in a high frequency signal line of said package, said high frequency signal line being electrically connected to said high frequency circuit element.

33. A high frequency circuit device comprising:

a package having an air-tight space inside thereof, said package including a substrate and a lid over a first surface of the substrate, said substrate having a hole in a second surface thereof;

a high frequency circuit element secured on said first substrate surface in said air-tight space;

a helical signal coil disposed in said hole formed in said second substrate surface; and a plurality of conductor patterns on said first substrate surface, wherein said conductor patterns constitute an electromagnetic shield between the helical signal coil and the high frequency circuit element.

* * * * *